US007616047B2

(12) United States Patent
Rees et al.

(10) Patent No.: US 7,616,047 B2
(45) Date of Patent: Nov. 10, 2009

(54) TRANSISTOR ARRANGEMENT FOR RECTIFIER AND INVERTER

(75) Inventors: Stephan Rees, Ludwigsburg (DE); Armin Ruf, Stuttgart (DE); Ulrich Ammann, Filderstadt (DE)

(73) Assignee: Robert Bosch GmbH, Stuttgart (DE)

( * ) Notice: Subject to any disclaimer, the term of this patent is extended or adjusted under 35 U.S.C. 154(b) by 174 days.

(21) Appl. No.: 11/569,580

(22) PCT Filed: Jan. 27, 2006

(86) PCT No.: PCT/EP2006/050482

§ 371 (c)(1),
(2), (4) Date: Nov. 24, 2006

(87) PCT Pub. No.: WO2006/092349

PCT Pub. Date: Sep. 8, 2006

(65) Prior Publication Data

US 2007/0182459 A1 Aug. 9, 2007

(30) Foreign Application Priority Data

Mar. 2, 2005 (DE) ......................... 10 2005 009 465

(51) Int. Cl.
*H01J 19/82* (2006.01)

(52) U.S. Cl. ........................................ 327/531; 327/434

(58) Field of Classification Search .................. 327/530, 327/531, 427, 434, 436, 108
See application file for complete search history.

(56) References Cited

U.S. PATENT DOCUMENTS

| 5,473,238 | A | | 12/1995 | Latham et al. |
| 5,736,890 | A | * | 4/1998 | Yee et al. ..................... 327/423 |
| 5,828,245 | A | * | 10/1998 | Brambilla et al. ........... 327/108 |
| 5,939,909 | A | * | 8/1999 | Callahan, Jr. ................ 327/108 |
| 6,294,903 | B1 | * | 9/2001 | Yamashita et al. .......... 323/282 |
| 6,294,941 | B1 | * | 9/2001 | Yokosawa .................... 327/309 |
| 6,597,592 | B2 | | 7/2003 | Carsten |
| 6,813,169 | B2 | * | 11/2004 | Inoue et al. ............... 363/56.04 |
| 2002/0012253 | A1 | | 1/2002 | Itoh et al. |

OTHER PUBLICATIONS

"A Smart Synchronous Rectifier for 12 V Automobile Alternators" S. Rees, U. Ammann; Proceedings of the 34TH IEEE PESC Conference 2003, p. 1516 et seq.; Acapulco, Mexico.

\* cited by examiner

*Primary Examiner*—Lincoln Donovan
*Assistant Examiner*—Hal L Nguyen
(74) *Attorney, Agent, or Firm*—Michael J. Striker

(57) ABSTRACT

A transistor arrangement has first and second terminals and a control terminal which sets a current flow between the first and second terminals, and a signal conditioning device which applies a transistor control voltage to the control terminal in a manner dependent on a differential voltage present between the first and second terminals, and a driving apparatus is assigned to the signal conditioning device and switches the latter between at least two operating modes.

10 Claims, 2 Drawing Sheets

TRANSISTOR ARRANGEMENT FOR RECTIFIER AND INVERTER

CROSS-REFERENCE TO RELATED APPLICATION

The invention described and claimed hereinbelow is also described in German Patent Application DE 10 2005 009 465.1 filed on Mar. 2, 2005. This German Patent Application provides the basis for a claim of priority of invention under 35 U.S.C. 119(a)-(d).

BACKGROUND OF THE INVENTION

The invention relates to a transistor arrangement, an arrangement for the rectification and/or inversion of at least one electrical voltage, and an apparatus for the rectification and/or inversion of at least one electrical voltage. The invention additionally discloses a use for a transistor arrangement or an arrangement according, a use for an apparatus, and also a method for controlling a transistor.

At the present time, rectifiers and inverters, within a wide power range, are in many cases constructed from voltage-controlled transistors that can be switched on and off. In this case, in particular for the conversion of a DC voltage into a three-phase AC voltage, or vice versa, a six-pulse bridge circuit is known wherein a DC voltage source can be connected to a three-phase voltage source via inductor/inductances. In this case, the field effect transistors (FET) in particular MOSFETS, are often used for voltages of less than 100 V. In this case, source terminal and the drain terminal of the individual transistors are connected to a diode (in the case of a MOSFET, said diode is already fundamentally contained in the transistor), the diodes then performing the rectification of the three AC currents in a simple manner without further control. For the inversion of the DC voltage, that is to say the converse case, a specific driving of the transistors is required in order to switch the latter on and off according to a known method (for example using fundamental clocking or pulse width modulation). It was recognized in this case that this drive circuit required for inverter operation can advantageously be used to relieve the load on the diodes during rectifier operation by switching on the transistors connected in parallel. Such a method is known inter alia by the term "synchronous rectification" and reduces the voltage loss during rectification. What is disadvantageous in this case, however, is that there is additional need for control to determine the switching-on and switching-off instants of the diodes and of the MOSFETs, in particular taking account of the necessary protection times. This outlay can be obviated when using a self-controlled transistor such as is known from the publications "Neuartige Gleichrichterprinzipien zur effizienten Speisung von Kfz-Bordnetzen aus Klauenpolgeneratoren" ["Novel rectifier principles for efficient supply of motor vehicle electrical systems from claw pole generators"] (U. Amann; Dissertation at the Institute for Power Electronics and Control Engineering at the University of Stuttgart, 2002) and "A Smart Synchronous Rectifier for 12 V Automobile Alternators" (S. Rees, U. Ammann; Proceedings of the 34th IEEE PESC Conference 2003, page 1516 et seq.; Acapulco, Mexico), although at the same time dispensing with the possibility of inverter operation. Therefore, there is still the desire for a simplified effective rectifier and inverter.

SUMMARY OF THE INVENTION

In the case of a transistor arrangement comprising a transistor, having a first and a second terminal and a control terminal, which sets a current flow between the first and second terminals, and furthermore comprising a signal conditioning device, which applies a transistor control voltage to the control terminal in a manner dependent on a differential voltage present between the first and second terminals the invention proposes a driving apparatus, which is assigned to the signal conditioning device and switches the latter between at least two operating modes. In the context of this application, a transistor is to be understood to mean any voltage-controlled semiconductor valve, that is to say any semiconductor component whose conducting-state property can be controlled by means of a voltage present. A first operating mode enables the transistor to be driven by means of the differential voltage, which would be utilized in an abovementioned rectifier and inverter circuit for the self-controlling operating mode (synchronous rectification), that is to say during a rectification of an AC voltage. In the second operating mode, which would be utilized in an abovementioned rectifier and inverter circuit for the inversion of a DC voltage, the differential voltage used for driving the transistor is superposed by an additional voltage or replaced by the latter. The aim here is to modify the driving used in the first operating mode such that the transistor is controlled, in particular is switched on or is switched into the conducting state, by means of a voltage independent of the differential voltage. A transistor arrangement which enables both self-controlling and externally actuated driving of the transistor is realized in this way. The advantages of such an arrangement are illustrated below, particularly in the exemplary embodiments.

Advantageously, the transistor is embodied as a FET, in particular as a MOSFET, the first terminal being the drain terminal, the second terminal being the source terminal and the control terminal being the gate terminal. For a multiplicity of applications, the transistor arrangement can thus be produced expediently and can nevertheless be operated with a considerable power.

According to one development of the invention, a current flow control element is arranged between the first and second terminals. A transistor usually permits a current flow from the first terminal to the second terminal. A current flow from the second terminal to the first terminal can be made possible by means of the current flow control element, if the transistor does not already have such an element anyway on account of its structural type, for example in the case of a MOSFET.

It is advantageous if the current flow control element is formed as a diode. This is a reliable and inexpensive realization possibility. In the case of a MOSFET, such a diode (body diode) is already contained in a manner dictated by the structural type.

The driving apparatus is preferably an inverter driving apparatus, which outputs a drive signal. Inverter driving apparatuses are used to drive the individual transistors of an inverter circuit. The invention enables the drive signal of a known inverter driving apparatus to be used for driving the signal conditioning device and thus indirectly the transistor. Although the drive signal can also be generated separately, an additional control circuit can be dispensed with if an existing inverter driving apparatus is utilized.

In one advantageous development of the invention, the driving apparatus drives the signal conditioning device by means of a substantially rectangular-waveform drive signal. This means that the drive signal has two levels, each of the levels corresponding to one of the operating modes mentioned. Therefore, in each case precisely one operating mode is selected nearby.

The transistor arrangement advantageously has a summation point that adds the drive signal to the differential voltage.

As a result, it is possible in a simple manner to feed in the drive signal for switching the different operating states of the signal conditioning device. The function of a transistor arrangement comprising a summation point configured in this way is explained in more detail in an exemplary embodiment.

The transistor arrangement preferably has a summation point that adds a substantially constant voltage to the differential voltage occasionally in a manner dependent on a drive signal of the driving apparatus. This constitutes a further possibility for feeding in the drive signal for switching the different operating states of the signal conditioning device in a simple manner. In comparison with the alternative described above, this decouples the driving of the signal conditioning device from the quality factor (for example level fidelity) of the signal from the inverter driving apparatus. This function of a transistor arrangement comprising a summation point configured in this way is also explained in more detail in an exemplary embodiment.

According to one preferred embodiment, the signal conditioning device has an amplifier for amplifying the differential voltage. The differential voltage can be amplified by means of the amplifier in such a way as to produce a coordination between the expected voltage interval of the differential voltage and the voltage interval required at the control terminal for correct operation of the transistor.

A voltage limiter is advantageously connected downstream of the amplifier. As a result, the amplifier can be set to a desired gain without the risk of a maximum desired or permissible level being exceeded at the control terminal. Moreover, it is thus possible to introduce an additional signal into the signal conditioning device without running the risk of the permissible level at the control terminal being exceeded with the additional signal.

Preferably, a switching device is assigned to the control terminal, which switching device can be actuated by means of the driving apparatus and optionally connects the control terminal to a voltage dependent on the differential voltage or to a voltage independent of the differential voltage. In this way, the operating states can be switched simply and without influencing the quality factor of the drive signal of the driving apparatus.

The invention additionally relates to an arrangement for the rectification and/or inversion of at least one electrical voltage, comprising a first and a second transistor arrangement and a branching location arranged between the transistor arrangements, the transistor arrangements being formed by means of one or more of the preceding claims, and also to an apparatus for the rectification and/or inversion of at least one electrical voltage comprising a plurality of the arrangements just mentioned, which are connected in parallel. Such arrangements or apparatuses can also be used in a targeted manner only for inversion or only for rectification, but the overall advantage of the invention is afforded precisely in the case of mixed rectifier and inverter operation.

The invention furthermore relates to the use of a transistor arrangement mentioned above and of an arrangement mentioned above in a rectifier and/or inverter circuit; in addition the use of an apparatus mentioned above for an electrical machine of a motor vehicle, in particular for a claw pole generator.

Finally, the invention relates to a method for controlling a transistor having a first and a second terminal and a control terminal which sets a current flow between the first and second terminals, a transistor control voltage being applied to the control terminal in a manner dependent on a differential voltage present between the first and second terminals and the transistor control voltage being influenced by a voltage independent of the differential voltage.

BRIEF DESCRIPTION OF THE DRAWINGS

The invention will now be explained in more detail on the basis of exemplary embodiments. In the figures.

DESCRIPTION OF THE PREFERRED EMBODIMENTS

Figure 1:
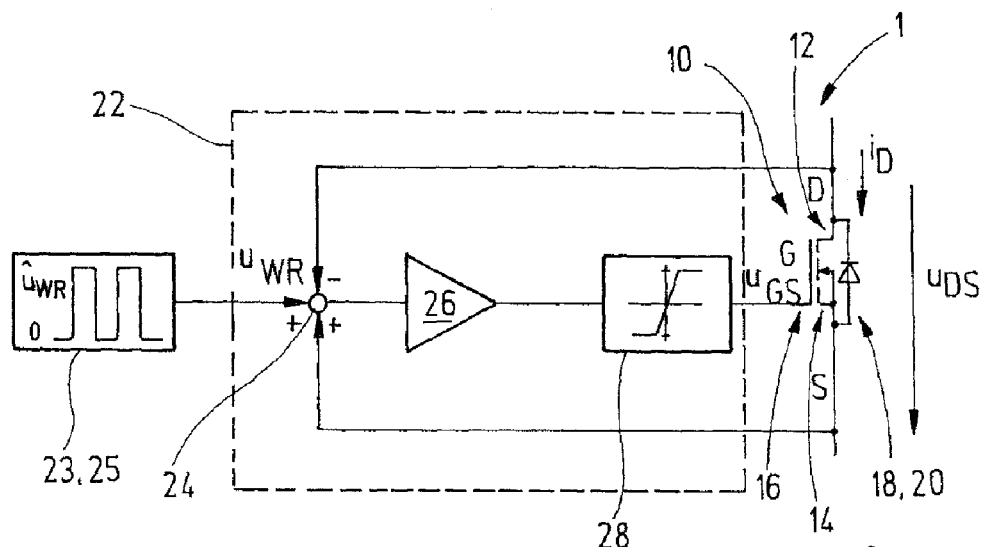
FIG. 1 shows a first exemplary embodiment of a transistor arrangement with a summation of the differential voltage and the drive signal.

FIG. 1 shows a first exemplary embodiment of a transistor arrangement 1 having a transistor 10, here embodied as a MOSFET, comprising a first terminal 12, here the drain terminal D, a second terminal 14, here the source terminal S, and a control terminal 16, here the gate terminal G. A current flow control element 18 is shown between the source terminal S and the drain terminal D, which current flow control element here is a diode 20 contained in the construction of the transistor 10 due to the structural type. A drain current $i_D$ flows into the transistor 10 and a differential voltage $u_{DS}$, here the so-called drain-source voltage, is dropped across the transistor 10, that is to say from the drain terminal D to the source terminal S. The transistor arrangement 1 furthermore has a signal conditioning device 22, which is supplied inter alia with the differential voltage $u_{DS}$ and applies a transistor control voltage $u_{GS}$ to the gate terminal G. The drain current $i_D$ is established in a manner dependent on the transistor control voltage $u_{GS}$ in a known manner. At a summation point 24 where the differential voltage $u_{DS}$ is already present, the signal conditioning device 22 is additionally supplied with an inverter signal $u_{WR}$ from a driving apparatus 23, here an inverter driving apparatus 25. The inverter signal $u_{WR}$ is a rectangular signal having a peak value $\hat{u}_{WR}$, as is used for driving known inverter circuits. In this case, the peak value $\hat{u}_{WR}$ is chosen to be greater than a maximally permanently occurring drain-source voltage. Accordingly, the voltage $-u_{DS}+u_{WR}$ is present at the summation point 24, the value of which voltage alternately results as $-u_{DS}$ and $-u_{DS}+\hat{u}_{WR}$, respectively. The voltage $-u_{DS}+u_{WR}$ is then fed to the amplifier 26, which has a gain factor K and thus outputs a voltage $K\cdot(-u_{DS}+u_{WR})$. Said voltage is kept within specific limits, namely between the minimum voltage value $u_{GSmin}$ and a maximum voltage value $u_{GSmax}$, by a limiter 28 connected downstream of the amplifier 26. The output voltage of the limiter 28 is then used as a transistor control voltage $u_{GS}$. For the case where $u_{WR}=0$, the function of the self-controlled transistor as mentioned in the introduction arises. The transistor 10 is therefore turned off for $u_{DS}>0$ and turned on for $u_{DS}<0$. This then affords—in a corresponding circuit—the basis for rectifier operation. If the case $u_{WR}=\hat{u}_{DR}$ is established, a positive voltage is present at the input of the amplifier 26 independently of the present value of the differential voltage $u_{DS}$ since $\hat{u}_{WR}$ has been chosen to be greater than the maximum differential voltage $u_{DS}$ (drain-source voltage). This means that the transistor 10—presupposing a suitable choice of the gain factor K and the limiter values $u_{GSmin}$ and $u_{GSmax}$—is switched on. Thus, the transistor arrangement 1 is then switched into its second operating mode, which—in a corresponding circuit—affords the basis for inverter operation. While the transistor control voltage $u_{GS}$ is therefore dependent on the differential voltage $u_{DS}$ in the first operating mode, this dependence is cancelled in the second operating mode by means of the signal addition described and the transistor is permanently switched on.

Figure 2:
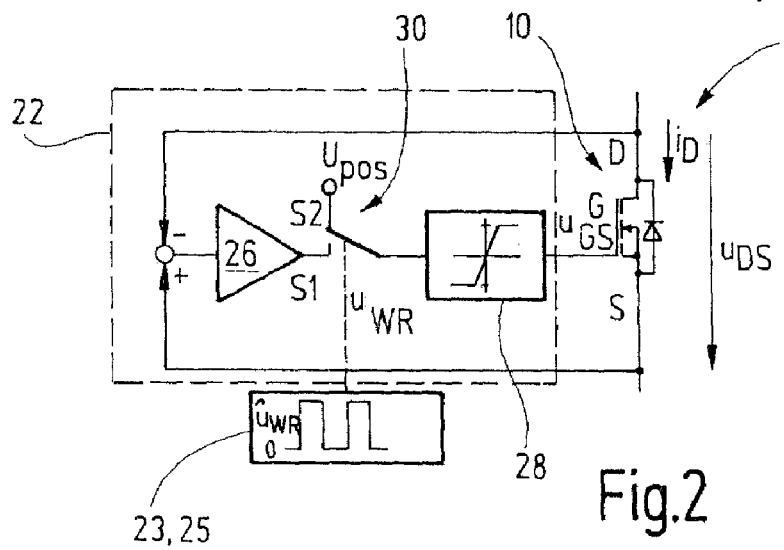
FIG. 2 shows a second exemplary embodiment of a transistor arrangement, in which a voltage dependent on or independent of the differential voltage is optionally applied to the control terminal.

FIG. 2 shows, in a second exemplary embodiment, a further possibility for effecting the two operating states. For this purpose, a switching device 30 having a first switching state S1 and a second switching state S2 has been arranged between the amplifier 26 and the limiter 28. In the first switching state S1, the switching device 30 connects the amplifier 26 to the limiter 28, so that the first operating mode already known is present. If changeover is made to the second switching state S2, then—in this exemplary embodiment—the input of the limiter 28 is now connected to a voltage source having the voltage $U_{pos}$. In this case, the value $U_{pos}$, is chosen with a magnitude such that the known second operating mode is established, in which the transistor control voltage $u_{GS}$, independently of the differential voltage $u_{DS}$, has a magnitude such that the transistor 10 is activated. In this case, the switching device 30 is actuated by means of the signal $u_{WR}$ from the inverter driving apparatus 25. If the level is below a specific threshold value, in particular approximately zero, the switching state S1 is set, and if the level lies above said threshold value, in particular at $\hat{u}_{WR}$ the switching state S2 is reached. The advantage of this driving resides inter alia in the fact that only minor requirements are to be made of the quality factor of the inverter drive signal since this signal influences the transistor control voltage $u_{GS}$ only indirectly.

Figure 3:
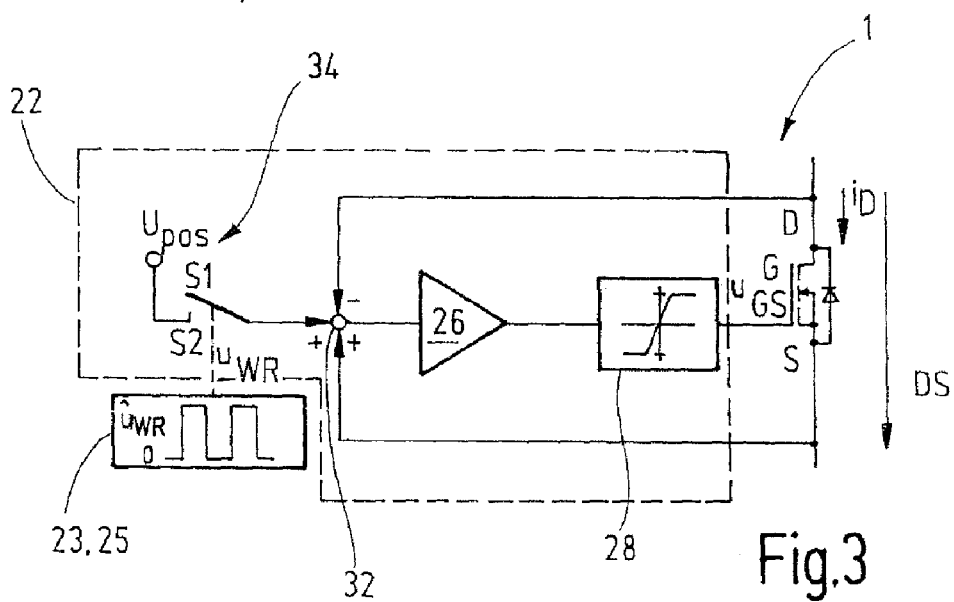
FIG. 3 shows a third exemplary embodiment of a transistor arrangement with a summation of the differential voltage and a voltage that is switched in occasionally by means of the drive signal.

A third exemplary embodiment is shown in FIG. 3. Here, the differential voltage $u_{DS}$ and a voltage $u_{pos}$ that can be switched by means of a switch 34 are added at a summation point 32. Here, too, the switch 34 is actuated by means of the signal $u_{WR}$ from the inverter driving apparatus 25. In the switching state S1, the voltage $u_{pos}$ is decoupled from the summation point 32. The known first operating mode is then present. In the switching state S2, the voltage $u_{pos}$ is fed to the summation point 32, said voltage being chosen with a magnitude such that the transistor control voltage $u_{GS}$—independently of the differential voltage $u_{DS}$—acquires a magnitude such that the transistor 10 is activated. The transistor arrangement 1 is then in the second operating mode. In comparison with the second exemplary embodiment, this variant affords the advantage that the switch 34 here switches between a conducting state and a high-impedance state, while the switching device 30 is used as changeover switch between two different conducting states. The switch 34 may therefore advantageously be embodied as a semiconductor switch, in particular a FET.

Figure 4:
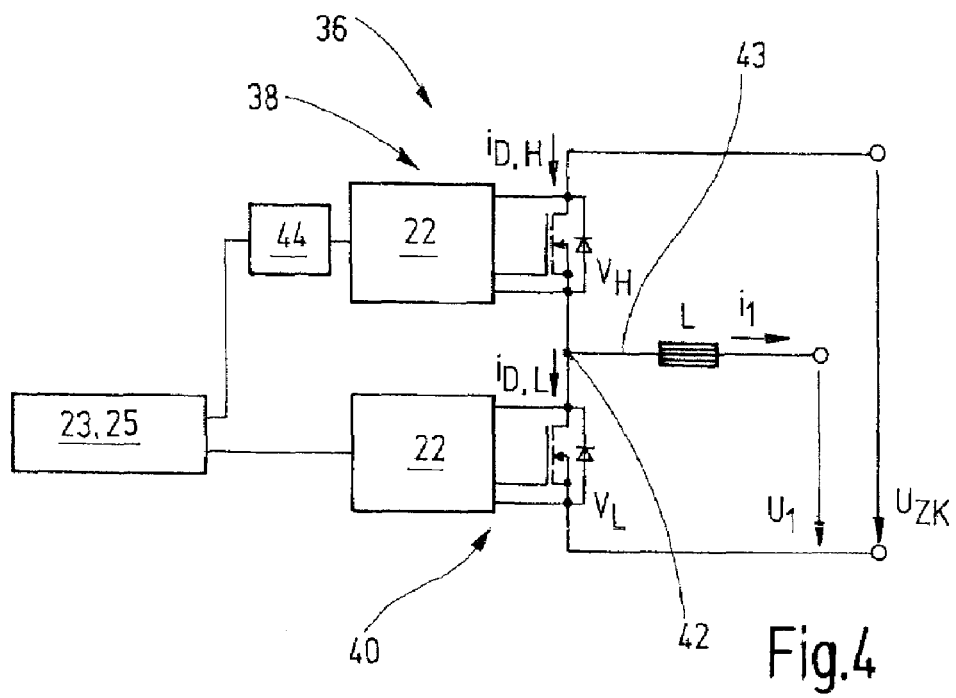
FIG. 4 shows an exemplary embodiment of an arrangement for rectification and/or inversion.

In FIG. 4 there is an exemplary embodiment of an arrangement 36 for the rectification and/or inversion of at least one electrical voltage, comprising a first and a second transistor arrangement $V_H$, $V_L$ and a branching location 42 arranged between the transistor arrangements $V_H$, $V_L$. An inductance L is arranged in the branch section 43. The functioning of the arrangement 36 is directly evident taking account of the knowledge of the person skilled in the art with respect to rectifier and/or inverter circuits and the above explanations with respect to the functioning of the transistor arrangements $V_H$, $V_L$. Attention shall merely be drawn to the level shifter 44, which is necessary to adapt the inverter drive signal for the first transistor arrangement $V_H$. Advantages that can be mentioned for such an arrangement 36 (rectifier and inverter branch) are that no additional driver circuit is necessary for the gate terminal G and that no additional control outlay is required for the rectifier operation since negative drain currents $i_{DH}$ and $i_{D,L}$ lead to the switching on of the respective transistor arrangement $V_H$, $V_L$. Furthermore, the transitions between the two operating modes "inverter" and "(synchronous) rectifier" are realized in a simple manner by turning on and off the drive commands for inverter operation.

A particular advantage of such an arrangement 36 in inverter operation will be explained below using the example of the fundamental-clocked supply of a resistive-inductive load on the AC current side. For this purpose, a point in time at which the first transistor arrangement $V_H$ carries a positive drain current $i_{D,H}=i_1$ and the second transistor arrangement $V_L$ is in the off state shall be considered. The load current $i_1$ is then intended to be commutated to the transistor arrangement $V_L$ by switching off the transistor arrangement $V_H$ and subsequently switching on said transistor arrangement $V_L$. In the case of the inverter driving according to the prior art, it is necessary to comply with latching times between the switch-on signals for the transistor arrangements $V_H$, $V_L$ in order to avoid a short circuit of the DC voltage $U_{ZK}$. In the case considered here, this inevitably leads to a short turning-on of the body diode in the transistor arrangement $V_L$ until the transistor arrangement $V_L$ is switched on. In the case of the fundamental clock oscillation, the sign of the load current will be reversed in the subsequent conduction time of the transistor arrangement $V_L$, so that an identical process follows during the commutation from the transistor arrangement $V_L$ to the transistor arrangement $V_H$. According to the prior art it is therefore necessary to be able to set the latching time to be very short and very accurately in the process. This is not necessary in the case of the arrangement 36 according to the invention since the current-receiving switching device transistor arrangement $V_H$ (or $V_L$) is switched on automatically. (It goes without saying, of course, that the switch-on signal for the current-receiving transistor arrangement $V_H$ (or $V_L$) is to be applied in the time between the receiving of current by the transistor arrangement $V_H$ (or $V_L$) and the change in sign of the load current $i_1$. The arrangement 36 therefore additionally permits simplified driving during operation as a fundamental-clocked inverter.

Figure 5:
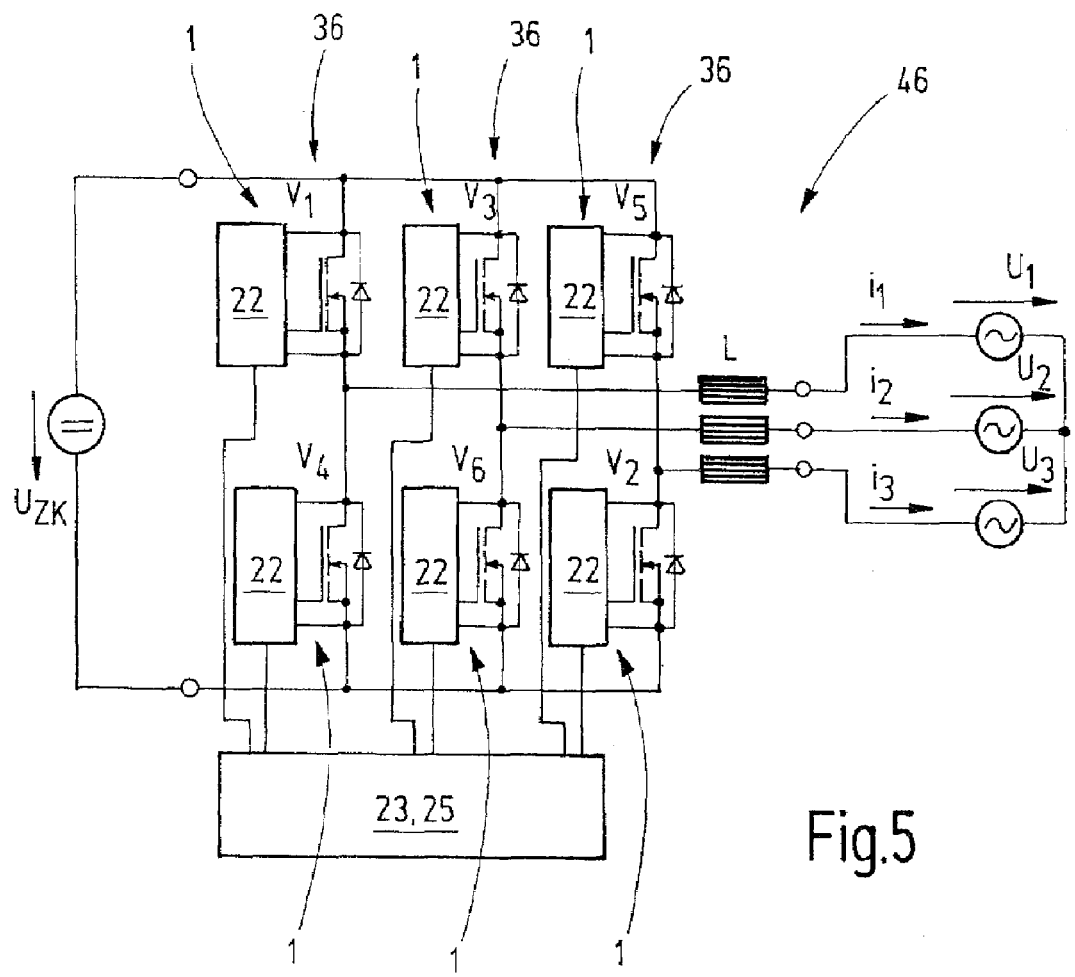
FIG. 5 shows an exemplary embodiment of an apparatus for rectification and/or inversion.

Finally, in FIG. 5 there is an apparatus 46 for rectification and/or inversion comprising three arrangements 36 having the transistor arrangements $V_1$ to $V_6$ that have already been explained comprehensively. The required level shifters are in this case integrated into the inverter driving apparatus 25. A DC voltage $U_{ZK}$ is present at one end of the apparatus 46 and three AC voltages $U_1$, $U_2$, $U_3$ are present at the other end. The functioning of the apparatus 46 is directly evident taking account of the knowledge of the person skilled in the art with respect to rectifier and/or inverter circuits and the above explanations with respect to the functioning of the transistor arrangements $V_1$ to $V_6$ and the arrangements 36 and therefore does not require any further explanation.

The invention is suitable in particular for connecting claw pole generators for motor vehicles to the motor vehicle electrical supply system. The inverter function can advantageously be utilized for the operation of a claw pole generator as a starter. By means of the improved synchronous rectifier function, the overall efficiency for power generation is improved and the so-called "initiation rotational speed" of the generator is reduced.

The invention claimed is:

1. Transistor arrangement (1) comprising a transistor (10), having a first and a second terminal (12, 14) and a control terminal (16), which sets a current flow ($i_D$) between the first and second terminals (12, 14), and furthermore comprising a signal conditioning device (22), which applies a transistor control voltage ($u_{GS}$) to the control terminal (16) in a manner dependent on a differential voltage ($u_{DS}$) present between the first and second terminals (12, 14), wherein a driving apparatus (23), which is assigned to the signal conditioning device (22) and switches the latter between at least two operating modes, and wherein a summation point (32) adds a substantially constant voltage ($U_{pos}$) to the differential voltage ($u_{DS}$) occasionally in a manner dependent on a drive signal ($u_{WR}$) of the driving apparatus (23).

2. Transistor arrangement (1) according to claim 1, wherein the transistor (10) is embodied as a FET, in particular as a MOSFET, the first terminal (12) being the drain terminal (D), the second terminal (14) being the source terminal (S) and the control terminal (16) being the gate terminal (G).

3. Transistor arrangement (1) according to claim 1, wherein a current flow control element (18) is arranged between the first and second terminals (12, 14).

4. Transistor arrangement (1) according to claim 3, wherein the current flow control element (18) is formed as a diode (20).

5. Transistor arrangement (1) according to claim 1, wherein the driving apparatus (23) is an inverter driving apparatus (25), which outputs a drive signal ($u_{WR}$).

6. Transistor arrangement (1) according to claim 1, wherein the driving apparatus (23) drives the signal conditioning device (22) by means of a substantially rectangular-waveform drive signal ($U_{WR}$).

7. Transistor arrangement (1) according to claim 1, wherein the signal conditioning device (22) has an amplifier (26) for amplifying the differential voltage ($U_{DS}$).

8. Transistor arrangement (1) according to one of the preceding claims, wherein a voltage limiter (26) is connected downstream of the amplifier (26).

9. Transistor arrangement (1) comprising a transistor (10), having a first and a second terminal (12, 14) and a control terminal (16), which sets a current flow ($i_D$) between the first and second terminals (12, 14), and furthermore comprising a signal conditioning device (22), which applies a transistor control voltage ($u_{GS}$) to the control terminal (16) in a manner dependent on a differential voltage ($u_{DS}$) present between the first and second terminals (12, 14), wherein a driving apparatus (23), which is assigned to the signal conditioning device (22) and switches the latter between at least two operating modes wherein the driving apparatus (23) is an inverter driving apparatus (25), which outputs a drive signal ($u_{WR}$), and wherein a summation point (24) adds the drive signal ($u_{WR}$) to the differential voltage ($u_{DS}$).

10. Transistor arrangement (1) comprising a transistor (10), having a first and a second terminal (12, 14) and a control terminal (16), which sets a current flow ($i_D$) between the first and second terminals (12, 14), and furthermore comprising a signal conditioning device (22), which applies a transistor control voltage ($u_{GS}$) to the control terminal (16) in a manner dependent on a differential voltage ($u_{DS}$) present between the first and second terminals (12, 14), wherein a driving apparatus (23), which is assigned to the signal conditioning device (22) and switches the latter between at least two operating modes, wherein a switching device (30) is assigned to the control terminal (16), which switching device can be actuated by means of the driving apparatus (23) and optionally connects the control terminal (16) to a voltage ($U_{pos}$) dependent on the differential voltage ($U_{DS}$) or to a voltage ($U_{pos}$) independent of the differential voltage ($U_{DS}$).

* * * * *